(12) United States Patent
Middlekauff et al.

(10) Patent No.: US 7,928,010 B2
(45) Date of Patent: Apr. 19, 2011

(54) METHOD FOR PRODUCING PORTABLE MEMORY DEVICES

(75) Inventors: Warren Middlekauff, San Jose, CA (US); Robert Miller, San Jose, CA (US); Charlie Centofante, Los Altos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/551,402

(22) Filed: Oct. 20, 2006

(65) Prior Publication Data
US 2008/0096317 A1 Apr. 24, 2008

(51) Int. Cl.
*H01L 21/44* (2006.01)
(52) U.S. Cl. ...................................................... 438/674
(58) Field of Classification Search ............... 438/11–18, 438/100, 105–107, 597, 612–613, 660–667; 257/48, 737, 315–317
See application file for complete search history.

(56) References Cited

U.S. PATENT DOCUMENTS

| | | | |
|---|---|---|---|
| 3,373,409 A * | 3/1968 | Lord | ............................ 365/102 |
| 4,713,298 A | 12/1987 | Hung et al. | |
| 5,490,891 A | 2/1996 | Farquhar et al. | |
| 5,502,289 A | 3/1996 | Takiar et al. | |
| 5,512,712 A | 4/1996 | Iwata et al. | |
| 5,596,225 A | 1/1997 | Mathew et al. | |
| 5,663,901 A | 9/1997 | Wallace et al. | |
| 5,877,544 A | 3/1999 | Rigal et al. | |
| 5,933,328 A | 8/1999 | Wallace et al. | |
| 6,085,412 A | 7/2000 | Iwasaki | |
| 6,151,248 A | 11/2000 | Harari et al. | |
| 6,235,555 B1 | 5/2001 | Cho | |
| 6,323,064 B1 | 11/2001 | Lee et al. | |
| 6,333,517 B1 | 12/2001 | Tamaki | |
| 6,368,899 B1 | 4/2002 | Featherby et al. | |
| 6,372,539 B1 | 4/2002 | Bayan et al. | |
| 6,399,415 B1 | 6/2002 | Bayan et al. | |
| 6,410,355 B1 | 6/2002 | Wallace | |
| 6,444,501 B1 | 9/2002 | Bolken | |
| 6,456,528 B1 | 9/2002 | Chen | |
| 6,489,218 B1 | 12/2002 | Kim et al. | |
| 6,537,842 B2 | 3/2003 | Akram | |

(Continued)

FOREIGN PATENT DOCUMENTS
EP 0 581 284 A 2/1994

(Continued)

OTHER PUBLICATIONS

Answer.com; http:/www.answers.com/electronic=ink?cat=technology.*

(Continued)

*Primary Examiner* — Charles D Garber
*Assistant Examiner* — Andre' C Stevenson
(74) *Attorney, Agent, or Firm* — Vierra Magen Marcus & DeNiro LLP (57) ABSTRACT

Improved techniques to produce integrated circuit products are disclosed. The improved techniques permit smaller and less costly production of integrated circuit products. One aspect of the invention concerns covering test contacts (e.g., test pins) provided with the integrated circuit products using printed ink. Once covered with the ink, the test contacts are no longer electrically exposed. Hence, the integrated circuit products are not susceptible to accidental access or electrostatic discharge. Moreover, the integrated circuit products can be efficiently produced in a small form factor without any need for additional packaging or labels to electrically isolate the test contacts.

11 Claims, 8 Drawing Sheets

U.S. PATENT DOCUMENTS

| | | | |
|---|---|---|---|
| 6,624,005 | B1 | 9/2003 | DiCaprio et al. |
| 6,677,183 | B2 | 1/2004 | Sakaguchi et al. |
| 6,705,925 | B1 | 3/2004 | Cole et al. |
| 7,051,142 | B2 | 5/2006 | Okamoto et al. |
| 7,094,633 | B2 | 8/2006 | Takiar |
| 7,293,716 | B1 * | 11/2007 | Miks .................... 235/492 |
| 7,402,897 | B2 * | 7/2008 | Leedy .................... 257/678 |
| 2002/0131251 | A1 | 9/2002 | Corisis et al. |
| 2004/0018667 | A1 | 1/2004 | Joshi et al. |
| 2004/0058478 | A1 | 3/2004 | Islam et al. |
| 2004/0090829 | A1 | 5/2004 | Miura et al. |
| 2004/0229401 | A1 | 11/2004 | Bolken et al. |
| 2004/0259291 | A1 | 12/2004 | Takiar |
| 2005/0013106 | A1 | 1/2005 | Takiar |
| 2005/0200676 | A1 * | 9/2005 | Kadomatsu et al. ........ 347/102 |
| 2005/0091811 | A1 | 10/2005 | Woudenberg |
| 2006/0020469 | A1 * | 1/2006 | Rast .................... 704/270 |
| 2006/0267165 | A1 | 11/2006 | Takiar |

FOREIGN PATENT DOCUMENTS

| | | |
|---|---|---|
| EP | 1 624 001 A | 2/2006 |
| WO | 02/069251 A1 | 9/2002 |

OTHER PUBLICATIONS

The MultiMedia Card System Summary, Version 3.2, MMCA Technical Committee, Jan. 2002.

High Capacity and Small Size, Meeting the Storage Needs to Today's Portable Devices, 2003 SanDisk Corporation.

Dean et al., "New Fine-Beam, Abrasive Water Jet Technology Enables Photonic and Small Device Singulation," Chip Scale Review, Aug./Sep. 2002, pp. 43, 45, 47.

"UV Cure Jetting Ink", Markem Corporation, Keene, NH., 2006, pp. 1-2.

"4000 DOD Ink Jet Printer", Markem Corporation, Keene, NH., 2006, pp. 1-2.

"4601", Markem Corporation, Keene, NH., 2006, pp. 1-2.

U.S. Appl. No. 11/551,423, entitled "Portable Memory Device", filed Oct. 20, 2006.

International Search Report and Written Opinion for PCT/US2007/081924, mailed on Apr. 18, 2008.

Office Action for U.S. Appl. No. 11/551,423, mailed Jun. 5, 2009.

Office Action dated Dec. 24, 2009 in U.S. Appl. No. 11/551,423.

Response to Office Action filed Apr. 26, 2010 in U.S. Appl. No. 11/551,423.

Office Action dated Sep. 28, 2010 in Taiwanese Patent Application No. 096139339.

Notice of Allowance and Fee(s) Due, dated Sep. 10, 2010 in U.S. Appl. No. 11/551,423, filed Oct. 20, 2006.

Office Action dated Dec. 13, 2010 in Korean Patent Application No. 2009-7010131.

* cited by examiner

METHOD FOR PRODUCING PORTABLE MEMORY DEVICES

CROSS-REFERENCE TO RELATED APPLICATION

This application is related to: (i) U.S. patent application Ser. No. 11/551,423, filed concurrently herewith, and entitled "PORTABLE MEMORY DEVICES", and which is hereby incorporated by reference herein; (ii) U.S. patent application Ser. No. 10/621,882, filed Jul. 17, 2003, and entitled "PERIPHERAL CARD WITH HIDDEN TEST PINS", and which is hereby incorporated by reference herein; and (iii) U.S. patent application Ser. No. 10/602,373, filed Jun. 23, 2003, and entitled "METHOD FOR EFFICIENTLY PRODUCING REMOVABLE PERIPHERAL CARDS", now U.S. Pat. No. 7,094,633, and which is hereby incorporated by reference herein.

BACKGROUND OF THE INVENTION

1. Field of the Invention

The present invention relates to integrated circuit products and, more particularly, to removable peripheral cards that contain one or more integrated circuits.

2. Description of the Related Art

As the trend for memory integrated circuit (IC) packages to be smaller and their memory density to be larger continues, advancements in packaging integrated circuits are needed. One recent advancement involves stacking multiple integrated circuit dies within a single IC package. Such internal package stacking involves stacking a smaller die on a larger die. Each of the dies is wire bonded to a substrate. This type of stacking has, for example, been used with same function dies (e.g., two Flash memory dies) or different function dies (e.g., one Flash memory die and one SRAM die). Additionally, stacking of two or three dies has been done for stacked Chip Scale Packages (stacked CSP) and stacked Thin Small Outline Packages (TSOP).

Memory cards are commonly used to store digital data for use with various products (e.g., electronic products). These memory cards are increasingly called on to store greater and greater amounts of data. Memory cards normally provide non-volatile data storage, and thus such memory cards are very popular and useful because they retain data even after being powered-off. Examples of memory cards are Flash cards that use Flash type or EEPROM type memory cells to store the data. Flash cards have a relatively small form factor and have been used to store digital data for products such as cameras, computers (hand-held, notebook and desktop computers), set-top boxes, hand-held or other small audio players/recorders (e.g., MP3 devices), and medical monitors. A major supplier of Flash cards is SanDisk Corporation of Sunnyvale, Calif.

In some cases, memory cards have conventionally been provided with a set of test pins that enable the memory card to be tested. Typically, the test pins are utilized at the manufacturing site to test internal portions of the memory cards. However, after the memory cards are tested and ready for distribution to end-users, the test pins should not be exposed to the end-users. In the past, these test pins have been covered by a plastic housing of the memory cards which is relatively expensive to manufacture. More recently, for memory cards that have test pins that are otherwise exposed, a label has been provided over the test pins. The label is effective at shielding the test pins from electrostatic discharges. The label is also effective to hide the test pins. However, the label does present some disadvantages. The application of a label to a memory card is a time consuming processing operation. In addition, the labels can be a relatively expensive part to the overall memory card. Still further, since memory cards are typically inserted into and removed from slots in consumer electronic devices, the memory cards need to reliably insert and eject. Often, the ejection process is mechanically assisted (e.g., spring-biased assistance). However, in some cases, the label can present substantial friction that partially impedes the spring-based ejection of the memory card. The label also presents sharp edges that can also impede removal or ejection of memory cards.

Thus, there is a need for improved approaches to manufacture memory cards having test pins.

SUMMARY OF THE INVENTION

Broadly speaking, the invention relates to improved techniques to produce integrated circuit products. The improved techniques permit smaller and less costly production of integrated circuit products. One aspect of the invention concerns covering test contacts (e.g., test pins) provided with the integrated circuit products using printed ink. Once covered with the ink, the test contacts are no longer electrically exposed. Hence, the integrated circuit products are not susceptible to accidental access or electrostatic discharge. Moreover, the integrated circuit products can be efficiently produced in a small form factor without any need for additional packaging or labels to electrically isolate the test contacts.

The integrated circuit products can pertain to removable peripheral cards or other removable media formed using semiconductor assembly techniques. One type of removable peripheral card is referred to as a memory card. Memory cards are typically small, integrated circuit-based products that provide data storage. These memory cards can be highly portable and plug into or are received by ports or connectors on electronic devices, including computers, cameras, mobile phones and PDAs.

The invention can be implemented in numerous ways, including as a system, apparatus, device or method. Several embodiments of the invention are discussed below.

As memory card, one embodiment of the invention includes at least: a circuit board having a front side and a back side, the front side including die attach pads, and the back side including I/O contacts and test contacts; at least one semiconductor die attached to the front side of the circuit board, the at least one semiconductor die being electrically connected to the die attach pads of the circuit board; a molding compound to encapsulate the at least one semiconductor die and the front side of the circuit board; and an ink coating provided over the test contacts on the back side of the circuit board but not over the I/O contacts on the back side of the circuit board.

As a method for producing a memory card, one embodiment of the invention includes at least: producing a plurality of memory cards, each of the memory cards having exposed test contacts; testing the memory cards using the exposed test contacts; and printing ink over the exposed test contacts on the memory cards.

As an electronic system, one embodiment of the invention includes at least a data acquisition device and a data storage device. The data storage device is capable of storing data acquired by the data acquisition device. The data storage device includes at least: a circuit board having a first side and a second side, the first side including die attach pads, and the second side including I/O contacts and test contacts; at least one semiconductor die attached to the first side of the circuit board, the at least one semiconductor die being electrically connected to the die attach pads of the circuit board; a molding compound to encapsulate the at least one semiconductor die and the first side of the circuit board; and an ink coating provided over the test contacts on the second side of the circuit board but not over the I/O contacts on the second side of the circuit board.

According to another embodiment, an integrated circuit product can be produced in a batch by operations that include at least: providing a multi-instance leadframe or substrate having a plurality of instances, each of the instances of the leadframe or substrate having test contacts and input/output (I/O) contacts; attaching one or more dies to each of the instances on at least one side of the multi-instance leadframe or substrate; electrically connecting each of the one or more dies to the respective instance of the leadframe or substrate; thereafter encapsulating together the plurality of instances on the at least one side of the multi-instance leadframe or substrate with a molding compound, wherein the test contacts and the I/O contacts remain exposed; subsequently singulating each of the plurality of instances; testing each of the plurality of instances using the exposed test contacts; and printing ink over the exposed test contacts on the plurality of instances. At least one of the plurality of instances being produced by the operations is the integrated circuit product.

As an integrated circuit product, one embodiment of the invention includes at least: a circuit board having a front side and a back side, the front side including die attach pads, and the back side including I/O contacts and test contacts; at least one semiconductor die attached to the front side of the circuit board, the at least one semiconductor die being electrically connected to the die attach pads of the circuit board; a molding compound to encapsulate the at least one semiconductor die and the front side of the circuit board; and an ink coating provided over the test contacts on the back side of the circuit board but not over the I/O contacts on the back side of the circuit board.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to improved techniques to produce integrated circuit products. The improved techniques permit smaller and less costly production of integrated circuit products. One aspect of the invention concerns covering test contacts (e.g., test pins) provided with the integrated circuit products using printed ink. Once covered with the ink, the test contacts are no longer electrically exposed. Hence, the integrated circuit products are not susceptible to accidental access or electrostatic discharge. Moreover, the integrated circuit products can be efficiently produced in a small form factor without any need for additional packaging or labels to electrically isolate the test contacts.

The integrated circuit products can be formed using semiconductor assembly techniques. The integrated circuit products can also have a reduced form factor. The reduced form factor can be on the order of chip scale packaging. Further, the form factor can be defined at the semiconductor assembly level of semiconductor manufacturing.

The integrated circuit products can pertain to removable peripheral cards. The removable peripheral cards can serve many applications and perform many different functions. One type of removable peripheral card is referred to as a memory card. Memory cards are typically small, integrated circuit-based products that provide data storage. These memory cards plug into or are received by ports or connectors on electronic devices, including computers, cameras, mobile phones and PDAs. The memory cards can be non-volatile memory cards. In one embodiment, the memory cards can contain multiple integrated circuit chips stacked on one or both sides of a substrate or leadframe.

Although various figures are discussed below with reference to memory cards, other integrated circuit products can be formed from such processing.

Embodiments of this aspect of the invention are discussed below with reference to FIGS. 1-12. However, those skilled in the art will readily appreciate that the detailed description given herein with respect to these figures is for explanatory purposes as the invention extends beyond these limited embodiments.

Figure 1:
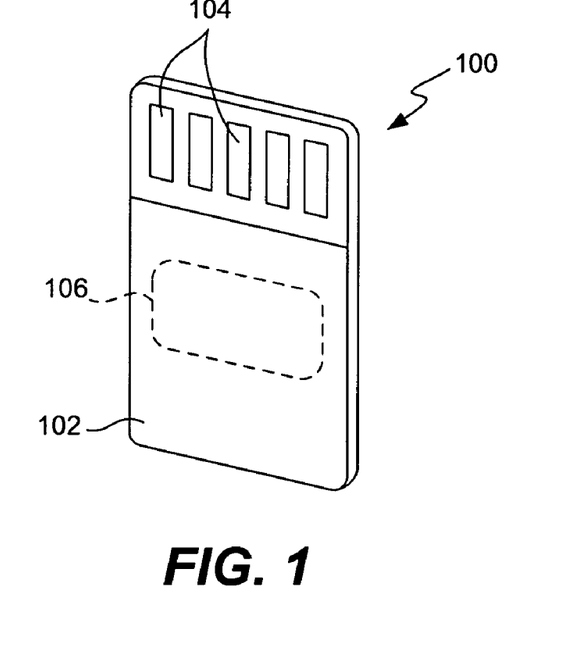
FIGS. 1 and 2 illustrate a memory card according to one embodiment of the invention.
Figure 2:
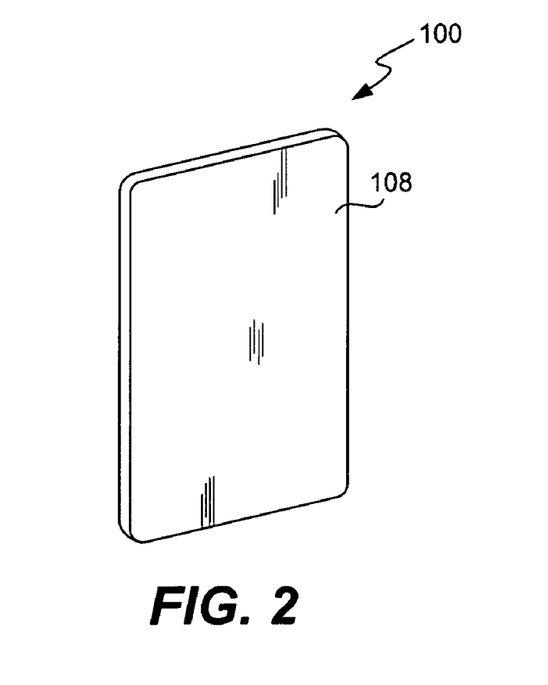

FIGS. 1 and 2 illustrate a memory card 100 according to one embodiment of the invention. In FIG. 1, a back side 102 of the memory card 100 is primarily depicted. In FIG. 2, a front side 108 of the memory card 100 is primarily depicted. The memory card 100 includes a plurality of input/output (I/O) contacts 104 (e.g., I/O pins) on the back side 102 of the memory card 100. Typically, as illustrated in FIG. 1, the I/O contacts 104 are provided towards one end of the memory card 100. In addition, the memory card 100 has an ink coating 106. The ink coating 106, as illustrated in FIG. 1, is provided on the back side 102 of the memory card 100.

Although not illustrated in FIG. 1, the back side 102 of the memory card 100 includes a plurality of test contacts (not shown) that are exposed on the back side 102 of the memory card 100 once assembled. These test contacts are utilized to test the memory card 100 after it has been assembled. After the testing of the memory card 100 has completed, access to the test contacts is no longer normally needed. Hence, according to one embodiment of the invention, the ink coating 106 is provided over the test contacts. The ink coating 106 provides electrical isolation for the test contacts which would otherwise be exposed. The ink coating 106 can prevent damage to electrical components or loss of stored data within the memory card 100 due to electrostatic discharge. The ink coating 106 can prevent unintentional access or damage to stored data within the memory card 100.

Further, since an end user typically has no need to utilize the test contacts, it is desirable that the test contacts not be visible to the user. Hence, in some embodiments, the ink coating 106 can operate to camouflage the test contacts. For example, if the back side 102 of the memory card 100 is black in color, the ink coating 106 could utilize black ink to coat the electrical contacts. As a result, the existence of the test contacts would have been camouflaged or masked so as to be not easily perceptible to end users of the memory card 100.

The test contacts are conventionally used to test some degree of internal functionality of the memory card. For example, when the memory card includes a controller integrated circuit (controller chip/die) and a separate memory integrated circuit (memory chip/die) with internal connections between the two chips, it may be desirable to monitor the communication between chips or to instruct the controller chip to release control of these connections to an external tester. This can be accomplished by issuing a special test command to the controller chip through the I/O pins of the memory card. Then, the tester can issue appropriate commands directly to the memory chip and test its functionality such as writing to and reading back from the memory chip. It may also be desirable to separately access the controller chip through these test pins, for example to perform JTAG testing.

It is also possible to use these test pins to preload content to the memory chip and thus make such content available to the end user. In some embodiments, this process may be performed faster than using the standard I/O contacts since the interface to the memory chip may be a parallel interface allowing more rapid data transfer than otherwise attainable through a host interface, which might bu a slower serial interface. In other embodiments, the ability to introduce higher voltages or source or sink higher currents than used during normal operation may be desirable such as when the memory chip is a one-time programmable device where the programming environment may be quite different than the user environment.

It is well known in the art that portable memory devices, such as memory cards, can come in various different sizes, shapes and forms. To the extent that any of these types of memory cards utilize test contacts on a surface of the card, the present invention can be utilized to electrically isolate and/or camouflage these test contacts.

Figure 3:
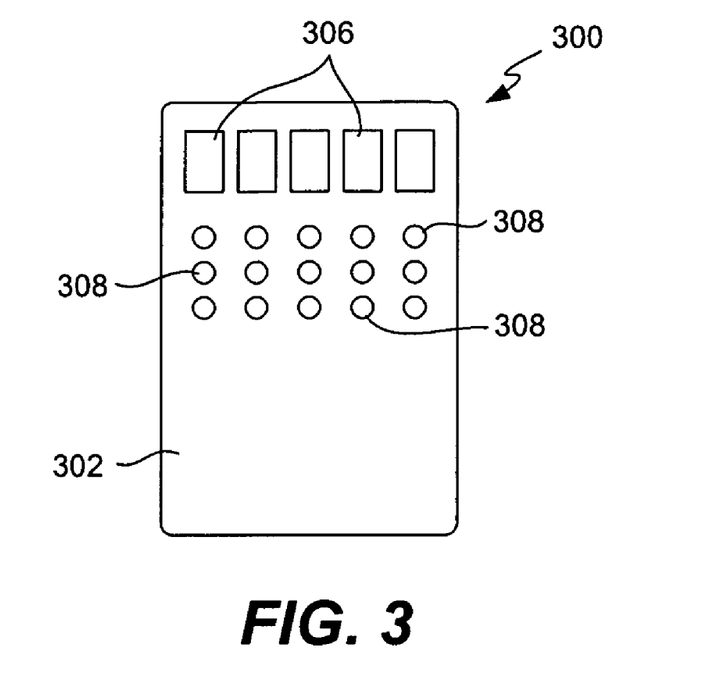
FIGS. 3 and 4 illustrate a memory card according to one embodiment of the invention.
Figure 4:
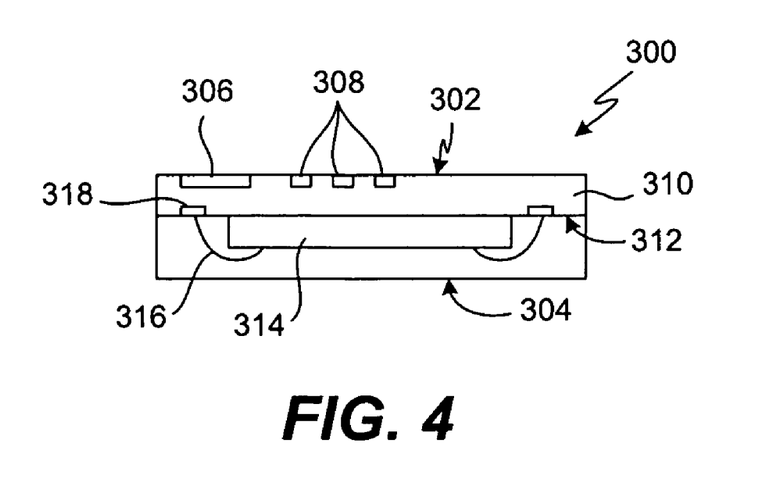

FIGS. 3 and 4 illustrate a memory card 300 according to one embodiment of the invention. The memory card 300 illustrated in FIGS. 3 and 4 is a memory card in which the card has been fully formed (i.e., assembled), except that the test contacts remain exposed. Namely, the memory card 300 includes a back side 302 and a front side 304. The back side 302 includes I/O contacts 306 as well as test contacts 308. As shown in FIG. 3, the test contacts 308 can be arranged as a two-dimensional array of test contacts.

FIG. 4 illustrates a cross-sectional view of the memory card 300. The back side 302 of the memory card 300 is formed from a back side of a circuit board 310. On the back side 302 are provided the I/O contacts 306 and the test contacts 308. The circuit board 310 also includes a front side 312. A semiconductor die 314 can attached to the front side 312 of the circuit board 310. In addition, a plurality of wire bonds 316 electrically connect the semiconductor die 314 to bonding pads 318 provided on the front side 312 of the circuit board 310. Although wire bonds 316 are utilized in FIG. 4, in other embodiments electrical connections can be made by other means (e.g., solder balls).

The memory card 300 illustrated in FIGS. 3 and 4 is assembled but not completely formed. The test contacts 308 in the memory card 300 illustrated in FIGS. 3 and 4 are exposed so that post-assembly testing can be performed. Following post-assembly testing, as discussed in detail below, an ink coating is provided over the test contacts 308. The resulting ink coating can be a uniform area that surrounds all of the test contacts 308. Alternatively, the ink coating can be concentrated over the individual test contacts 308. The ink coating can be formed, for example, by an ink jet printing action. The ink jet printing action operates (via a series of nozzles) to shoot small droplets of ink onto a surface with high precision. The nozzles are part of a print head that can be moved back and forth (e.g., by a stepper motor) with respect to the surface being printed. The surface being printed can also be moved relative to the print head. The ink can be printed with high resolution and with one or more colors. The ink jet printing action can be induced by various technologies such as known in the art, including piezo or thermal ink jet printers. For example, suitable ink jet print heads can be obtains by vendors such as Markem Corporation of Keene, N.H.

Although the test contacts 308 can be arranged as a two-dimensional array of test contacts as illustrated in FIG. 3, it should be understood that the test contacts can more generally be arranged in a wide range of configurations on any side or surface of a memory card. The test contacts can also be provided on more than one side or surface of a memory card. The number of test contacts can also vary with implementation (e.g., testing needs or requirements).

Figure 5:
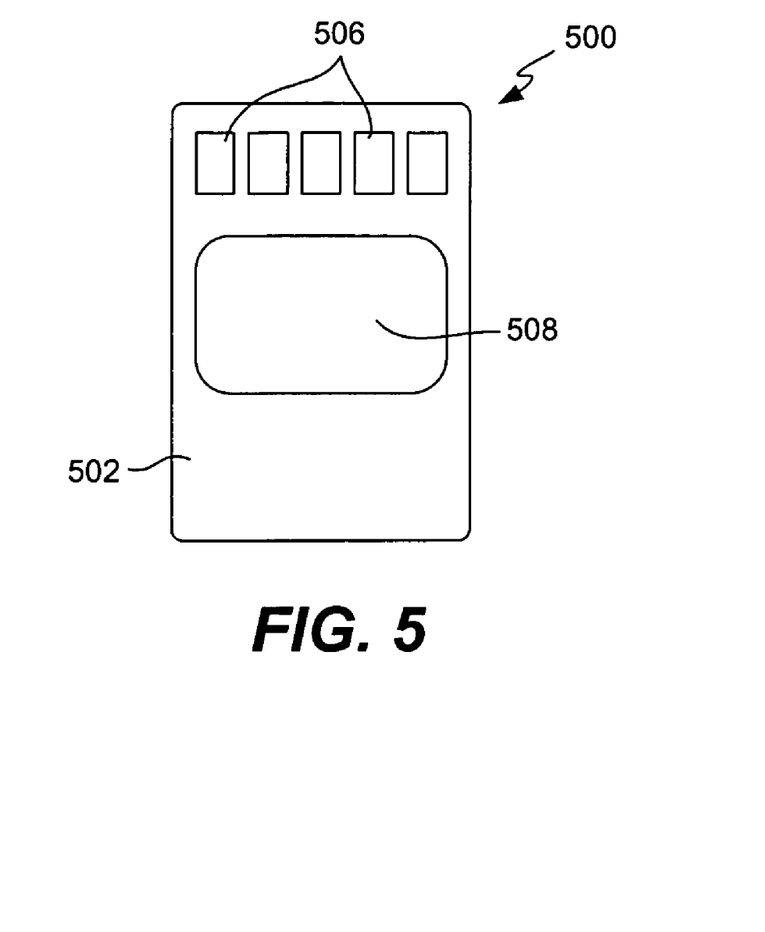
FIGS. 5 and 6 illustrate a memory card according to one embodiment of the invention.
Figure 6:
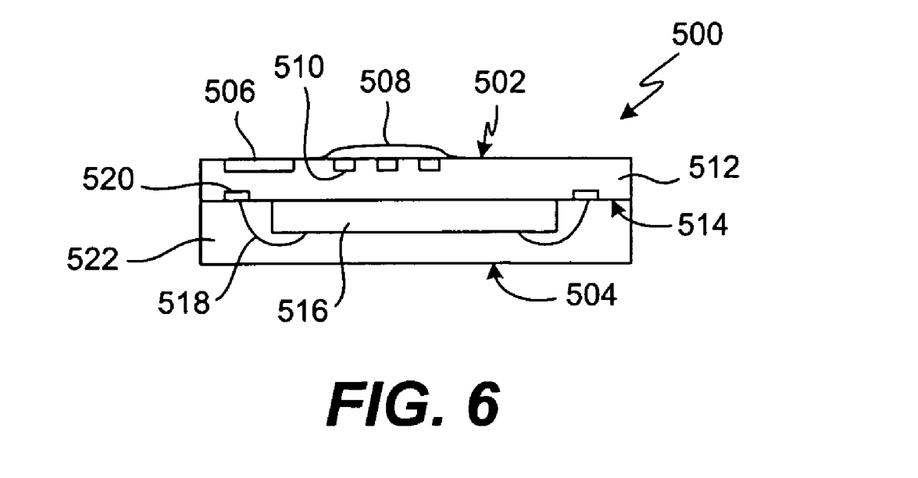

FIGS. 5 and 6 illustrate a memory card 500 according to one embodiment of the invention. The memory card 500 has a back side 502 and a front side 504. In FIG. 5, the back side 502 of the memory card 500 is depicted. In FIG. 6, a cross-sectional view of the memory card 500 is depicted. The back side 502 of the memory card 500 includes I/O contacts 506 and an ink coating region 508. As shown in FIG. 6, the ink coating region 508 coats all of test contacts 510 with a single, contiguous region of ink. The test contacts 510 are provided at the back side 502 of a circuit board 512. The I/O contacts 506 are also provided at the back side 502 of the circuit board 512. The circuit board 502 also includes a front side 514. A semiconductor die 516 is attached to the front side 514 of the circuit board 512. A plurality of wire bonds 518 can serve to electrically connect the semiconductor die 516 to the circuit board 512 via bonding pads 520 provided at the front surface 514 of the circuit board 512. A molding compound 522 can be formed around the semiconductor die 516 and the wire bonds 518 to form the front side 504 of the memory card 500.

As shown in FIG. 6, the edges of the ink coating region 508 are rounded. Given a memory card, such as the memory card 500, is typically inserted and removed from various consumer electronic devices, the presence of the rounded edges for the ink coating 508 are advantageous since it is not only results in less frictional resistance to insertion or removal but is also less likely to cause an obstruction or interference as compared to prior art approaches.

The front side 504 of the memory card 500 is a formed molding compound 522 that encompasses the semiconductor die 516, the wire bonds 518, and the remaining portion of the front surface 514 of the circuit board 512. The molding compound 522 thus forms the front portion (including the front side 504) of the memory card 500. The circuit board 512 forms the back portion (including the back side 502) of the memory card 500.

Figure 7:
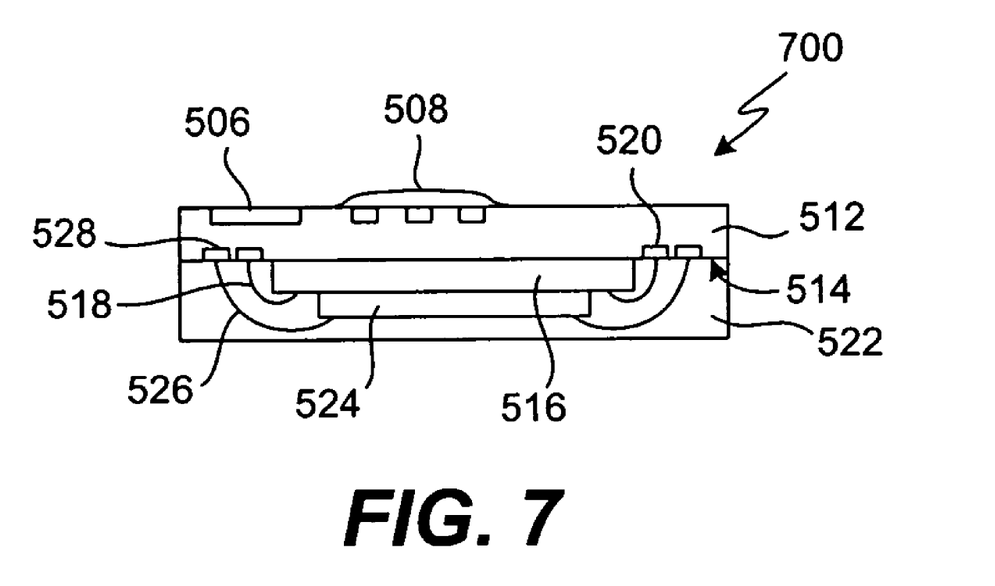
FIG. 7 illustrates a cross-sectional view of a memory card according to one embodiment of the invention.

FIG. 7 illustrates a cross-sectional view of a memory card 700 according to one embodiment of the invention. The memory card 700 illustrated in FIG. 7 is generally similar to the memory card 500 illustrated in FIG. 6. However, the memory card 700 further includes a second semiconductor die 524 that is attached to the upper surface of the semiconductor die 516. For example, a layer of adhesive (not shown) can be provided between the semiconductor die 516 and the second semiconductor die 524. The wire bonds 518 electrically connect the semiconductor die 516 to die pads 520 provided on the front surface 514 of the circuit board 512. Wire bonds 526 electrically connect the semiconductor die 524 to die pads 528 provided on the front surface 514 of the circuit board 512. In one implementation, the semiconductor die 516 can pertain to a memory array that provides data storage and the second semiconductor die 524 can provide a controller that controls access to the memory array by way of the I/O contacts 506.

Figure 8:
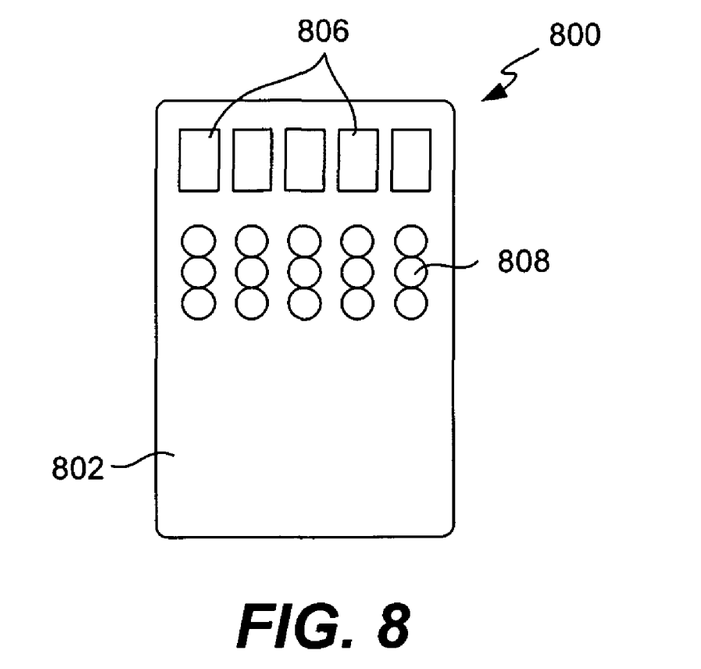
FIGS. 8 and 9 illustrate a memory card according to another embodiment of the invention.
Figure 9:
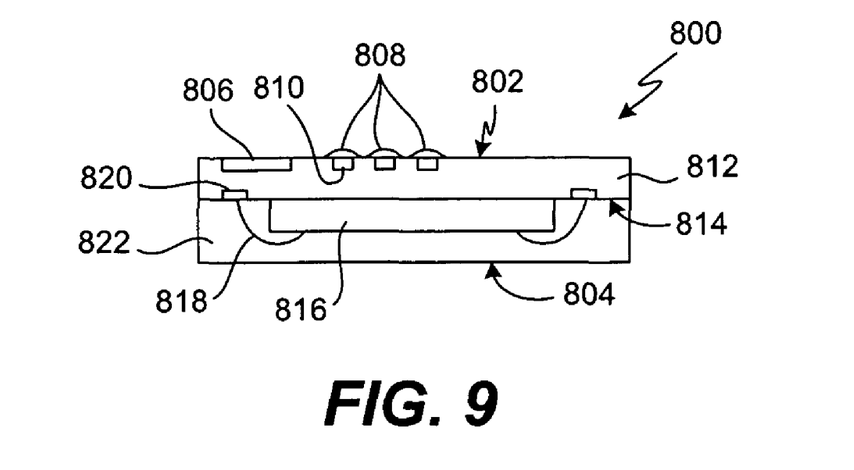

FIGS. 8 and 9 illustrate a memory card 800 according to another embodiment of the invention. The memory card 800 has a back side 802 and a front side 804. The back side 802 of the memory card 800 is illustrated in FIG. 8. In FIG. 9, a cross-sectional view of the memory card 800 is illustrated. The back side 802 of the memory card 800 includes a plurality of I/O contacts 806. In addition, the back side 802 of the memory card 800 includes a plurality of ink deposits 808. The ink deposits 808 are respectively provided over electrical contacts 810. For example, the electrical contacts 810 being provided under the ink deposits 808 can be arranged similar to the electrical contacts 308 illustrated in FIG. 3. The back side 802 of the memory card 800 is a back side of a circuit board 812. A front side 814 of the circuit board 812 has a semiconductor die 816 attached thereto. The semiconductor die 816 is electrically connected by wire bonds 818 to die pads 820 provided on the front surface 814 of the circuit board 812.

The front side 804 of the memory card 800 is a formed molding compound 822 that encompasses the semiconductor die 816, the wire bonds 818, and the remaining portion of the front surface 814 of the circuit board 812. The molding compound 822 thus forms the front portion (including the front side 804) of the memory card 800. The circuit board 812 forms the back portion (including the back side 802) of the memory card 800.

In this embodiment, the ink deposits 808 are deposited on the back side 802 of the memory card 800 over the corresponding test contacts 810. By controlling the quantity of ink being dispensed over each of the electrical contacts 810, the surface of the back side 802 can be substantially smooth, particularly when the test contacts 810 are slightly recessed within the back side 802 of the circuit board 812.

The ink being utilized to provide the ink coating or ink deposits can vary depending upon implementation. In one embodiment, the test contacts are formed of a conductive metal, such as gold or copper. In such case, it is advantageous to provide an ink that would adhere to such metal. One example of a suitable ink is available from Markem Corporation of Keene, N.H., and can be referred to as a UV cured ink. In one implementation, the ink can include a Cycloaliphatic epoxy resin at 40-60% by weight. Alternatively, a less expensive ink could be utilized if a preparatory coating were provided over the test contacts. The preparatory coating would be designed to adhere to the test contacts and thus permit the ink to in turn adhere to the preparatory coating.

Figure 10:
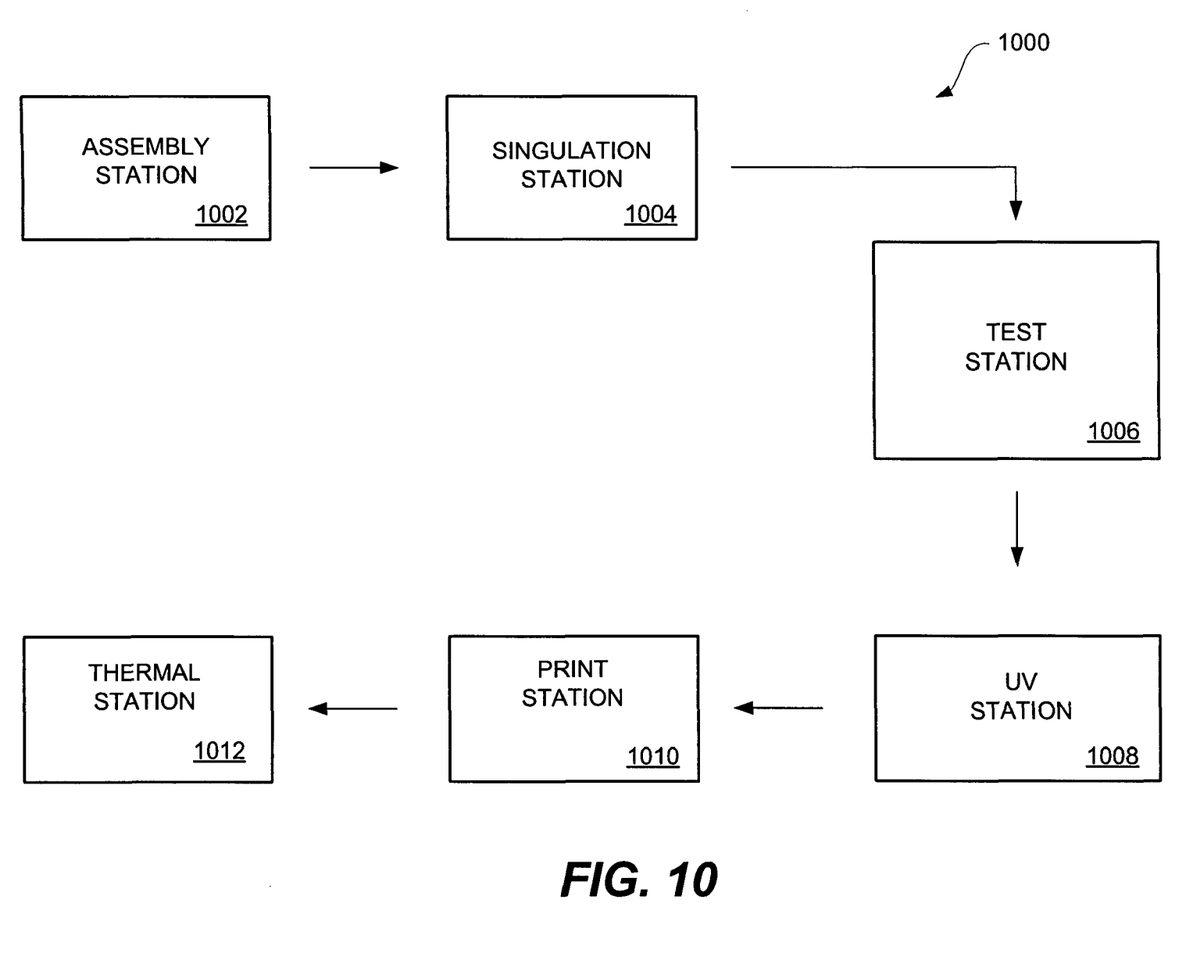
FIG. 10 is a flow diagram of a final assembly process according to one embodiment of the invention.

FIG. 10 is a flow diagram of a final assembly process 1000 according to one embodiment of the invention. The final assembly process 1000 provides an assembly station 1002. At the assembly station 1002, a plurality of memory cards can be assembled in a batch-automated process. In this regard, a circuit board with I/O contacts and test contacts can be provided, one or more semiconductor dies can be placed in contact with a first side of the circuit board, and a molding compound can be formed on at least one side of the circuit board so as to encapsulate the one or more semiconductor dies. A second side of the circuit board can provide I/O contacts (e.g., I/O pins) and test contacts (e.g., test pins). Once assembly has been completed at the assembly station 1002, the memory cards being assembled are directed to a singulation station 1004. At the singulation station 1004, the memory cards are singulated into individual memory cards. Typically, the memory cards are assembled at the assembly station 1002 as a strip of memory cards. The singulation station 1004 can operate to cut the strip of memory cards into individual memory cards.

Following the singulation station 1004, a test station 1006 can be provided to test the individual memory cards. Here, the test station 1006 can utilize the test contacts that have been formed on the memory cards for the purpose of testing. Assuming that the testing completes successfully for the memory cards, the memory cards are then directed to a print station 1008. At the print station 1008, ink is printed onto the back side of the memory cards to cover the test contacts. After the ink has been printed onto the back side of the memory cards so as to cover the test contacts, the memory cards are directed to a ultraviolet (UV) station 1010. At the UV station 1010, the ink that has been dispensed onto the back side of the memory cards is exposed to UV radiation to chemically activate the curing of the ink. In this embodiment, the ink is UV cured ink. Thereafter, the memory cards are supplied to a thermal station 1012. At the thermal station 1012, the memory cards are heated (or baked) for a predetermined period of time so as to accelerate the curing of the dispensed ink.

Figure 11:
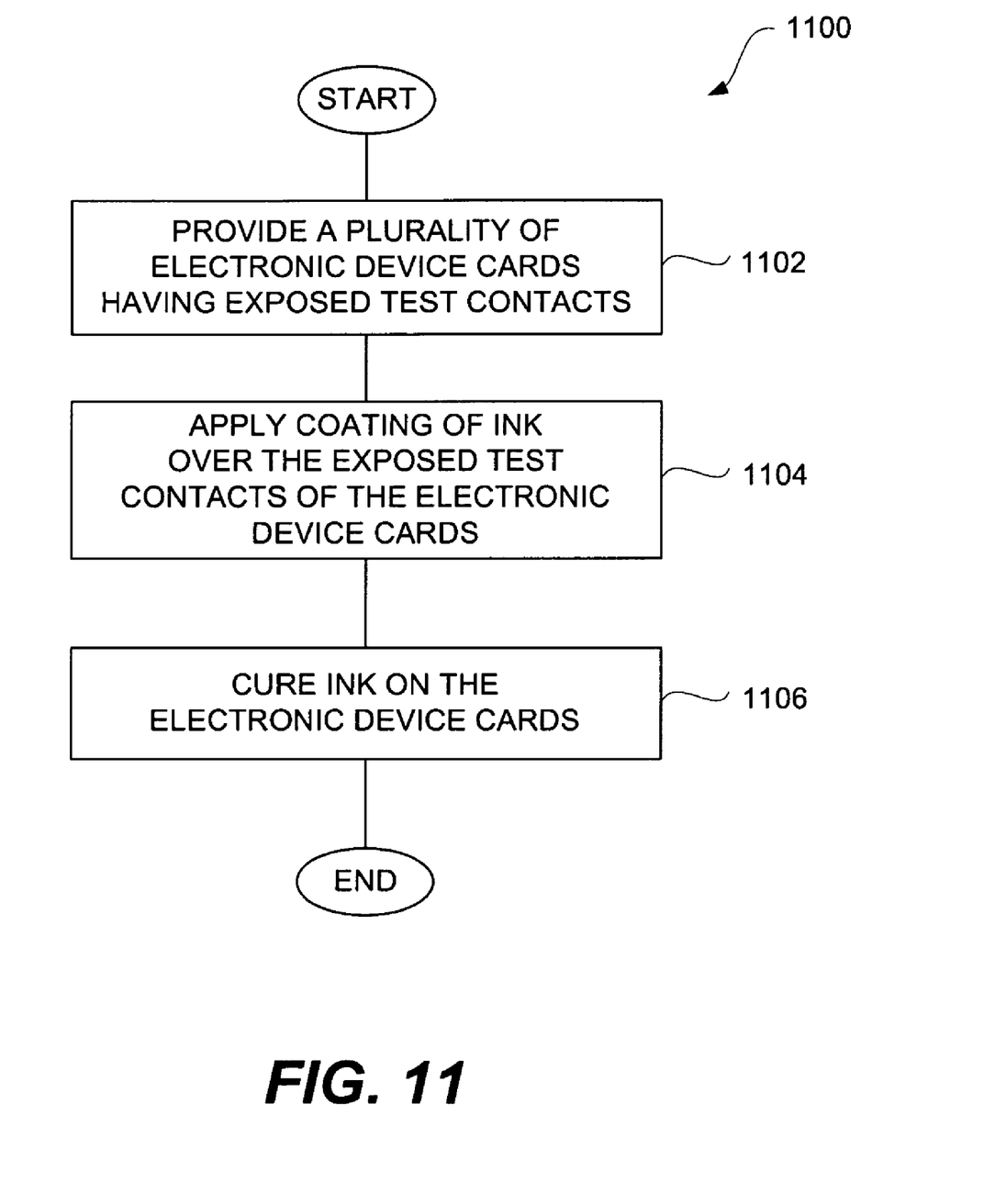
FIG. 11 is a flow diagram of an electronic device card production process according to one embodiment of the invention.

FIG. 11 is a flow diagram of an electronic device card production process 1100 according to one embodiment of the invention. The electronic device card production process 1100 initially provides 1102 a plurality of electronic device cards having exposed test contacts. The plurality of electronic device cards being provided 1102 can be provided as individual electronic device cards, a strip of adjacent electronic device cards, or an array of electronic device cards. The strip or array of electronic devices can subsequently singulated into individual electronic device cards.

At this stage of the production of the electronic device cards, the electronic device cards are substantially complete and have been successfully tested. Hence, the exposed test contacts no longer need to be exposed and can now be protected. Accordingly, the electronic device card production process 1100 next applies 1104 a coating of ink over the exposed test contacts of the electronic device cards. Thereafter, the ink that has been applied 1104 on the electronic device cards can be cured 1106. The curing process can vary depending upon the composition of the ink. In one embodiment, the ink is a UV-cured ink. In such case, the curing 1106 of the ink can utilize UV radiation to chemically activate the curing process that can thereafter be followed by a thermal (or baking) process to accelerate the curing process. For example, the UV exposure can be for 4-20 seconds and the baking process can for approximately twenty (20) minutes at about 140° C. Following the block 1106, the electronic device card production process 1100 ends, with the electronic device cards being produced in their final form.

Figure 12:
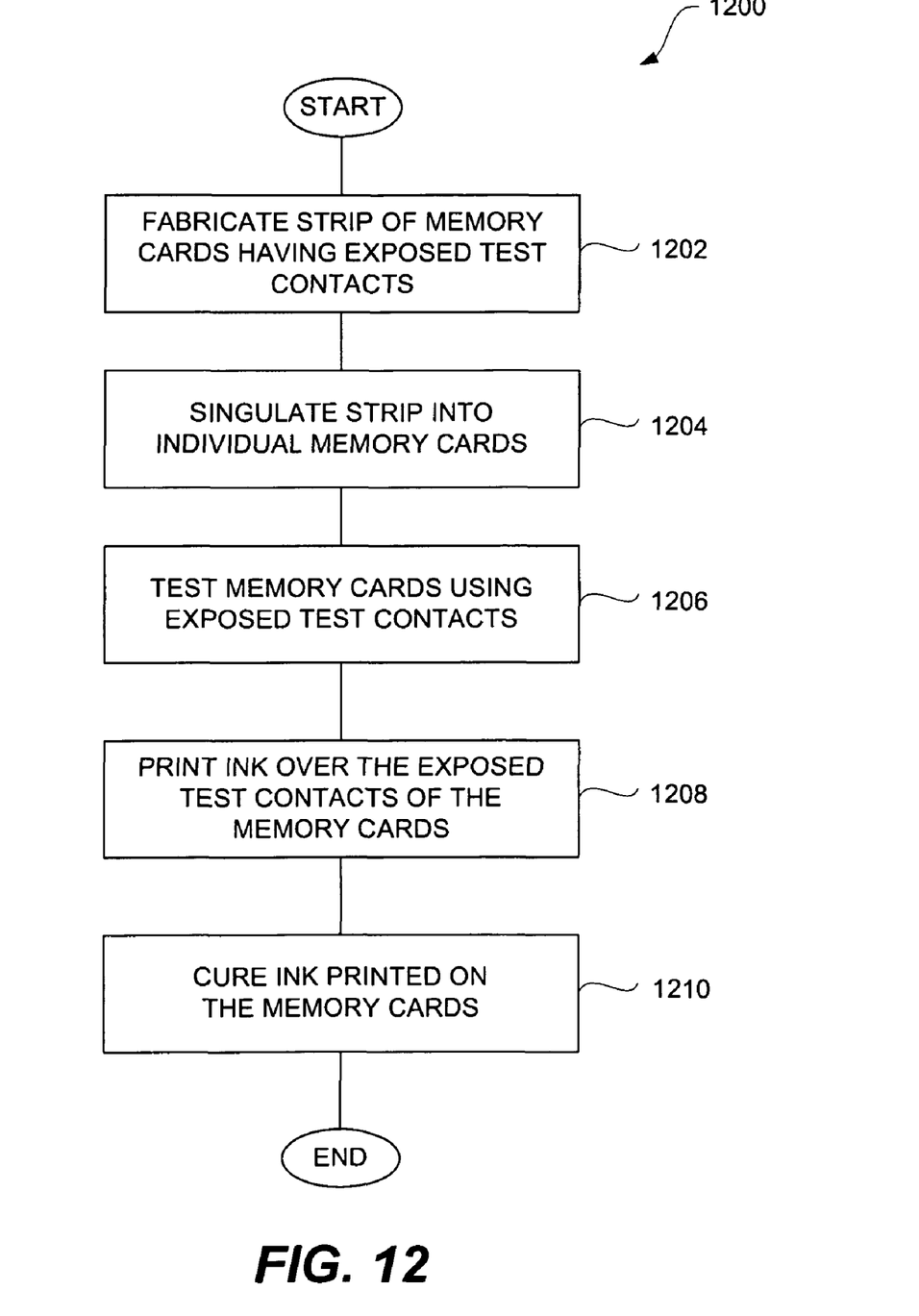
FIG. 12 is a flow diagram of a memory card production process according to one embodiment of the invention.

FIG. 12 is a flow diagram of a memory card production process 1200 according to one embodiment of the invention. The memory card production process 1200 is, for example, one implementation of the electronic device card production process 1100 illustrated in FIG. 11.

The memory card production process 1200 initially fabricates 1202 a strip of memory cards having exposed test contacts. Next, the strip of memory cards is singulated 1204 into individual memory cards. The memory cards are then tested 1206 using the exposed test contacts associated with each of the memory cards. After testing has successfully completed, ink is printed 1208 over the exposed test contacts of the memory cards. Thereafter, the ink printed on the memory cards is cured 1210. The printed ink can serve to camouflage or mask the test contacts. Additionally, the printed ink can carry text and/or graphics for labeling, marking, marketing, etc.

In one embodiment, the ink being printed 1208 on the memory card is a UV cured ink. Hence, in such an embodiment, the ink is cured 1210 by first applying UV radiation to the ink printed on the memory cards and then applying heat to the ink to accelerate the curing process.

Included within the scope of the invention is the possibility that the various steps of FIGS. 11 and 12 are performed at different times and in different physical locations.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for producing a memory card, said method comprising:

producing a plurality of memory cards, each of the memory cards having encapsulation and exposed test contacts visible through the encapsulation on a first surface;

testing the memory cards using the exposed test contacts;

controlling a quantity of ink to be printed over the exposed test contacts;

camouflaging the test contacts by printing the controlled quantity of ink over the exposed test contacts on the memory cards, the ink having the same color and appearance of the encapsulation thereby creating a substantially smooth surface of uniform color and appearance across the first surface and the previously exposed test contacts; and curing the ink that has been printed over the exposed test contacts using ultraviolet radiation, wherein the ink is UV curable.

2. A method as recited in claim 1, wherein said printing prints the ink over an area that encompasses the exposed test contacts.

3. A method as recited in claim 1, wherein each of the memory cards has a first side and a second side, with the second side having the exposed test contacts and I/O contacts.

4. A method as recited in claim 3, wherein said printing prints the ink on the second side so as to cover at least the exposed test contacts but not the I/O contacts.

5. A method as recited in claim 1, wherein said producing of the memory cards comprises:

fabricating the memory cards as a strip of memory cards; and singulating the strip into individual memory cards.

6. A method as recited in claim 1, wherein said curing comprises:

exposing the ink that has been printed to ultraviolet radiation; and subsequently heating the ink.

7. A method as recited in claim 1, wherein said printing of the ink is performed with a plurality different colored inks 8. A method as recited in claim 1, wherein the ink printed over the test contacts protects the test contacts from electrostatic discharge.

9. A method as recited in claim 1, wherein the ink printed over the test contacts is provided in a plurality of different colors to provide one or more markings on the memory card.

10. A method as recited in claim 9, wherein the marking includes one or more of a logo, a product name, or a trade designation.

11. A method as recited in claim 1, wherein said printing substantially only prints ink over the exposed test contacts on the memory cards.

\* \* \* \* \*